(12) United States Patent
Huang

(10) Patent No.: US 12,051,718 B2
(45) Date of Patent: Jul. 30, 2024

(54) METHOD FOR FABRICATING SEMICONDUCTOR DEVICE WITH ASSISTANT LAYER

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/196,551

(22) Filed: May 12, 2023

(65) Prior Publication Data
US 2024/0021666 A1    Jan. 18, 2024

Related U.S. Application Data

(62) Division of application No. 17/864,468, filed on Jul. 14, 2022.

(51) Int. Cl.
| H01L 21/762 | (2006.01) |
| H01L 21/02  | (2006.01) |
| H01L 49/02  | (2006.01) |

(52) U.S. Cl.
CPC ........ *H01L 28/87* (2013.01); *H01L 21/02532* (2013.01); *H01L 21/76251* (2013.01)

(58) Field of Classification Search
CPC .............. H01L 28/87; H01L 21/02532; H01L 21/76251; H01L 28/60; H01L 28/40–92; H01L 23/5222–5225
See application file for complete search history.

(56) References Cited

U.S. PATENT DOCUMENTS

| 2005/0006686 A1 | 1/2005 | Saida et al. |
| 2005/0208718 A1* | 9/2005 | Lim ................... H01L 21/02178 438/785 |
| 2011/0117718 A1* | 5/2011 | Nakamura ........... H10B 12/318 438/387 |

FOREIGN PATENT DOCUMENTS

TW    201639001 A    11/2016

OTHER PUBLICATIONS

Office Action and the search report mailed on Oct. 16, 2023 related to Taiwanese Application No. 112100435.

\* cited by examiner

*Primary Examiner* — Mary A Wilczewski
*Assistant Examiner* — Nathan Pridemore
(74) *Attorney, Agent, or Firm* — Xuan Zhang

(57) ABSTRACT

The present application provides a method for fabricating a semiconductor device. The method includes providing a first substrate; sequentially stacking a lower dielectric layer, a first dielectric layer, and a higher dielectric layer on the first substrate; forming a capacitor structure on the first substrate, along the lower dielectric layer, the first dielectric layer, and the higher dielectric layer, and extending upwardly from the higher dielectric layer; forming a second dielectric layer on the higher dielectric layer; forming a contact opening along the second dielectric layer to expose an exposed portion of the capacitor structure; selectively forming an assistant layer on the exposed portion over the second dielectric layer and the higher dielectric layer; forming a contact structure on the exposed portion and in the contact opening; and forming a bonding structure on the contact structure.

4 Claims, 15 Drawing Sheets

METHOD FOR FABRICATING SEMICONDUCTOR DEVICE WITH ASSISTANT LAYER

CROSS-REFERENCE TO RELATED APPLICATION

This application is a divisional application of U.S. Non-Provisional application Ser. No. 17/864,468 filed 14 Jul. 2022, which is incorporated herein by reference in its entirety.

TECHNICAL FIELD

The present disclosure relates to a semiconductor device and a method for fabricating the semiconductor device, and more particularly, to a semiconductor device with an assistant layer and a method for fabricating the semiconductor device with the assistant layer.

Discussion of the Background

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first substrate; a capacitor structure positioned on the first substrate and including an exposed portion; a contact structure deposited on the exposed portion; an assistant layer positioned between the contact structure and the exposed portion; and a bonding structure positioned on the contact structure. The assistant layer includes germanium or silicon germanium.

Another aspect of the present disclosure provides a semiconductor device including a first substrate; a capacitor structure positioned on the first substrate and including an exposed portion; a contact structure deposited on the exposed portion; an assistant layer positioned between the contact structure and the exposed portion; and a through substrate via positioned on the contact structure. The assistant layer includes germanium or silicon germanium.

Another aspect of the present disclosure provides a method for fabricating a semiconductor device including providing a first substrate; sequentially stacking a lower dielectric layer, a first dielectric layer, and a higher dielectric layer on the first substrate; forming a capacitor structure on the first substrate, along the lower dielectric layer, the first dielectric layer, and the higher dielectric layer, and extending upwardly from the higher dielectric layer; forming a second dielectric layer on the higher dielectric layer; forming a contact opening along the second dielectric layer to expose an exposed portion of the capacitor structure; selectively forming an assistant layer on the exposed portion over the second dielectric layer and the higher dielectric layer; forming a contact structure on the exposed portion and in the contact opening; and forming a bonding structure on the contact structure. The assistant layer includes germanium or silicon germanium.

In some embodiments, the exposed portion comprises silicon and/or germanium with substantially no oxygen and nitrogen.

In some embodiments, the first dielectric layer and the second dielectric layer comprise the same material.

In some embodiments, the first dielectric layer consists essentially of silicon oxide.

In some embodiments, the lower dielectric layer and the higher dielectric layer comprise the same material.

In some embodiments, the higher dielectric layer consists essentially of silicon nitride.

In some embodiments, a ratio of a width of the exposed portion to a width of the contact structure is between about 0.3 and about 0.7.

In some embodiments, a ratio of a height of the exposed portion to a depth of the contact structure is between about 0.02 and about 0.40.

In some embodiments, selectively forming the assistant layer on the exposed portion over the second dielectric layer and the higher dielectric layer comprises introducing a reactive gas to the contact opening, and the reactive gas comprises a germanium precursor.

In some embodiments, the germanium precursor comprises one or more of germane, digermane, isobutylgermane, chlorogermane, or dichlorogermane.

Due to the design of the semiconductor device of the present disclosure, the resistance of the capacitor structure may be reduced by employing the assistant layer formed on the exposed portion of the capacitor structure. Therefore, the exposed area of the capacitor structure may be further reduced. As a result, the overlay window between the contact structure to the capacitor structure may be increased which increases the flexibility of design rule.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
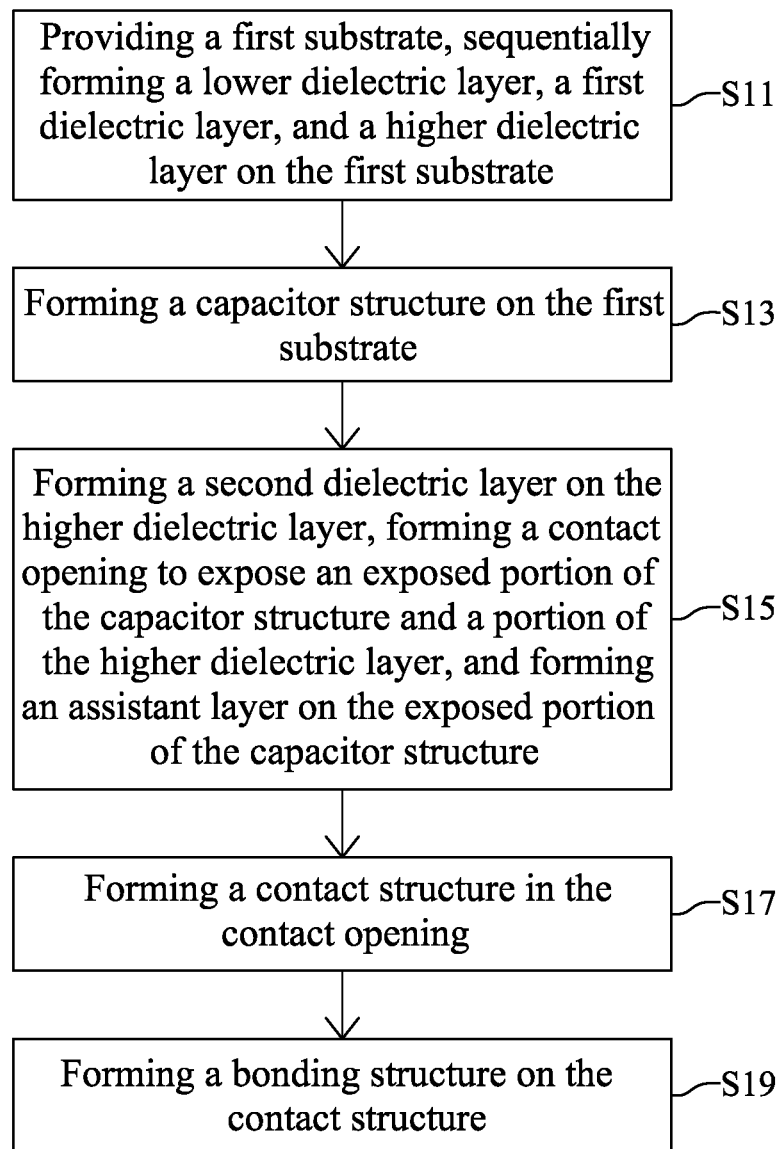
FIG. 1 illustrates, in a flowchart diagram form, a method 10 for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor device 1A in accordance with one embodiment of the present disclosure. FIGS. 2 to 11 illustrate, in schematic cross-sectional view diagrams, a flow for fabricating the semiconductor device 1A in accordance with one embodiment of the present disclosure.

Figure 2:
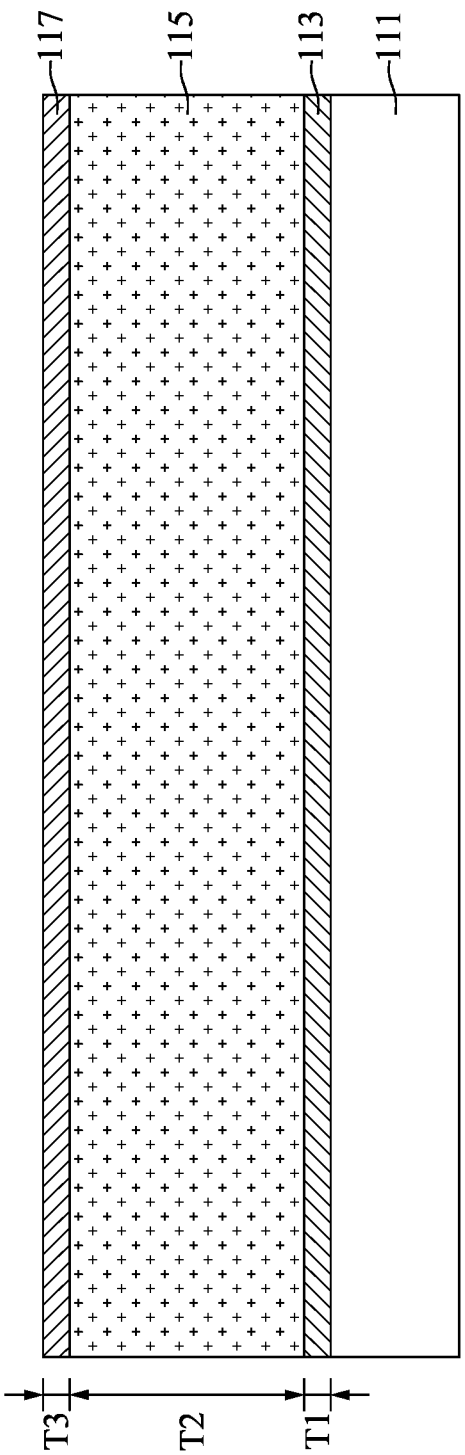
FIGS. 2 to 11 illustrate, in schematic cross-sectional view diagrams, a flow for fabricating the semiconductor device in accordance with one embodiment of the present disclosure.

With reference to FIGS. 1 and 2, at step S11, a first substrate 111 may be provided, a lower dielectric layer 113, a first dielectric layer 115, and a higher dielectric layer 117 may be sequentially formed on the first substrate 111.

With reference to FIG. 2, in some embodiments, the first substrate 111 may include a bulk semiconductor substrate that is composed entirely of at least one semiconductor material, a plurality of device elements (not shown for clarity), a plurality of dielectric layers (not shown for clarity), and a plurality of conductive features (not shown for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the first substrate 111 may further include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, in the description of present disclosure, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The plurality of device elements may be formed on the first substrate 111. Some portions of the plurality of device elements 111 may be formed in the first substrate 111. The plurality of device elements may be transistors such as complementary metal-oxide-semiconductor transistors, metal-oxide-semiconductor field-effect transistors, fin field-effect-transistors, the like, or a combination thereof.

The plurality of dielectric layers may be formed on the first substrate 111 and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

The plurality of conductive features may include interconnect layers, conductive vias, and conductive pads. The interconnect layers may be separated from each other and may be horizontally disposed in the plurality of dielectric layers along the direction Z. In the present embodiment, the topmost interconnect layers may be designated as the conductive pads. The conductive vias may connect adjacent interconnect layers along the direction Z, adjacent device element and interconnect layer, and adjacent conductive pad and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

With reference to FIG. 2, the lower dielectric layer 113 may be formed on the first substrate 111. In some embodiments, the lower dielectric layer 113 may be formed of, for example, silicon nitride, silicon oxynitride, silicon nitride oxide, silicon oxycarbide, silicon oxycarbonitride, or a combination thereof. The lower dielectric layer 113 may be formed by a deposition process such as chemical vapor deposition, plasma-enhanced chemical vapor deposition, atomic layer deposition, or other applicable deposition process. A planarization process may be performed after the deposition process to remove excess material and provide a substantially flat surface for subsequent processing steps. In the present embodiment, the lower dielectric layer 113 is formed of silicon nitride. In some embodiments, the lower dielectric layer 113 may consist essentially of silicon nitride.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

It should be noted that, in the description of the present disclosure, a feature which "consists essentially of" an identified material comprises greater than 95%, greater than 98%, greater than 99% or greater than 99.5% of the stated material on an atomic basis.

In some embodiments, the first dielectric layer 115 may be formed on the lower dielectric layer 113. In some embodiments, the first dielectric layer 115 may be formed of a material having etching selectivity to the lower dielectric layer 113. In some embodiments, the first dielectric layer 115 may be formed of, for example, silicon oxide, borophosphosilicate glass, undoped silicate glass, fluorinated silicate glass, low-k dielectric materials such as a spin-on low-k dielectric layer or a chemical vapor deposition low-k dielectric layer, or a combination thereof. In some embodiments, the first dielectric layer 115 may include a self-planarizing material such as a spin-on glass or a spin-on low-k dielectric material such as SiLK™. The use of a self-planarizing dielectric material may avoid the need to perform a subsequent planarizing step. In some embodiments, the first dielectric layer 115 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps. In the present embodiment, the first dielectric layer 115 is formed of silicon oxide. In some embodiments, the first dielectric layer 115 may consist essentially of silicon oxide.

With reference to FIG. 2, the higher dielectric layer 117 may be formed on the first dielectric layer 115. In some embodiments, the higher dielectric layer 117 may be formed of the same material as the lower dielectric layer 113. In some embodiments, the higher dielectric layer 117 may be formed of, for example, silicon nitride, silicon oxynitride, silicon nitride oxide, silicon oxycarbide, silicon oxycarbonitride, or a combination thereof. The higher dielectric layer 117 may be formed by a deposition process such as chemical vapor deposition, plasma-enhanced chemical vapor deposition, atomic layer deposition, or other applicable deposition process. A planarization process may be performed after the deposition process to remove excess material and provide a substantially flat surface for subsequent processing steps. In the present embodiment, the higher dielectric layer 117 is formed of silicon nitride. In some embodiments, the higher dielectric layer 117 may consist essentially of silicon nitride.

In some embodiments, the lower dielectric layer 113, the first dielectric layer 115, and the higher dielectric layer 117 may be referred to as part of the dielectric layer of the first substrate 111.

With reference to FIG. 2, in some embodiments, the thickness T1 of the lower dielectric layer 113 may be less than the thickness T2 of the first dielectric layer 115. In some embodiments, the thickness T2 of the first dielectric layer 115 may be greater than the thickness T3 of the higher dielectric layer 117. In some embodiments, the thickness T3 of the higher dielectric layer 117 and the thickness T1 of the lower dielectric layer 113 may be substantially the same. In some embodiments, the thickness T1 of the lower dielectric layer 113 and the thickness T3 of the higher dielectric layer 117 may be different. For example, the thickness T3 of the higher dielectric layer 117 may be greater than the thickness T1 of the lower dielectric layer 113.

Figure 3:
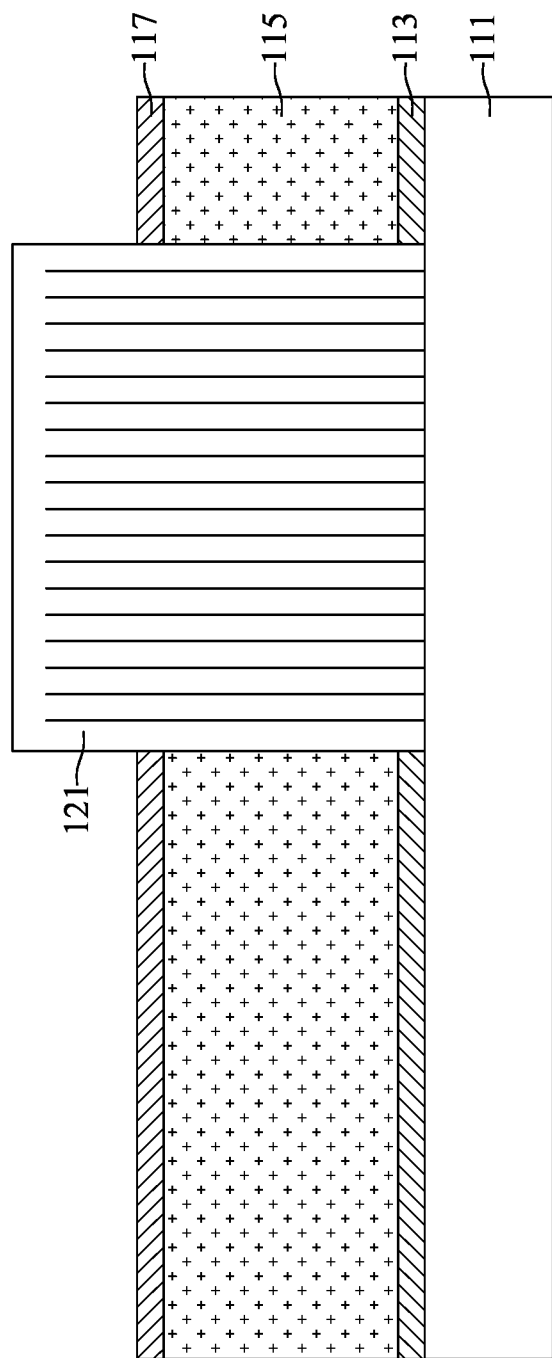

With reference to FIGS. 1 and 3, at step S13, a capacitor structure 121 may be formed on the first substrate 111.

With reference to FIG. 3, a capacitor opening (not shown for clarity) may be formed along the higher dielectric layer 117, the first dielectric layer 115, and the lower dielectric layer 113 to expose a portion of the first substrate 111. The capacitor structure 121 may be formed in the capacitor opening and may be electrically coupled to the device element of the first substrate 111 through the corresponding conductive features of the first substrate 111. The capacitor structure 121 may protrude from the top surface of the higher dielectric layer 117. In some embodiments, the capacitor structure 121 may include a bottom plate (not shown for clarity), a top plate (not shown for clarity), and an insulating layer (not shown for clarity) formed between the bottom plate and the top plate. The bottom plate may be configured to electrically couple to the device element of the first substrate 111. The insulating layer may be configured to electrically insulate the bottom plate and the top plate. The top plate may be configured to electrically connect to a conductive feature such as a bonding structure 150 which will be illustrated later.

It should be noted that, in the description of the present disclosure, a surface of an element (or a feature) located at the highest vertical level along the dimension Z is referred to as a top surface of the element (or the feature). A surface of an element (or a feature) located at the lowest vertical level along the dimension Z is referred to as a bottom surface of the element (or the feature).

In some embodiments, the bottom plate may be formed of, for example, doped polycrystalline silicon, doped polycrystalline germanium, doped polycrystalline silicon germanium, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The bottom plate may be formed by, for example, chemical vapor deposition, physical vapor deposition, sputtering, the like, or other applicable deposition process.

In some embodiments, the insulating layer may be conformally formed on the bottom plate. In some embodiments, the insulating layer may include, for example, a high-k material, an oxide, a nitride, an oxynitride or a combination thereof. The high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof. Other high-k materials may be selectively used for the high-k material. In some embodiments, the insulating layer may be formed by a deposition process including, for example, atomic layer deposition, chemical vapor deposition, plasma enhanced chemical vapor deposition, or other applicable deposition process.

In some embodiments, the top plate may be formed of the same material as the bottom plate. In some embodiments, the top plate may be formed of, for example, doped polycrystalline silicon, doped polycrystalline germanium, doped polycrystalline silicon germanium, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the top plate may include silicon and/or germanium with substantially no oxygen and nitrogen. As used in this regard, a feature with "substantially no oxygen and nitrogen" has less than 2%, less than 1% or less than 0.5% oxygen and nitrogen on an atomic basis. In some embodiments, the top plate consists essentially of silicon, germanium, or silicon germanium.

In some embodiments, the top plate top plate may be formed by, for example, chemical vapor deposition, physical vapor deposition, sputtering, the like, or other applicable deposition process.

In some embodiments, the capacitor structure 121 may be configured as a decoupling capacitor or may be configured as an array capacitor.

With reference to FIG. 1 and FIGS. 4 to 6, at step S15, a second dielectric layer 119 may be formed on the higher dielectric layer 117, a contact opening CO may be formed to expose an exposed portion 121E of the capacitor structure 121 and a portion of the higher dielectric layer 117, and an assistant layer 131 may be formed on the exposed portion 121E of the capacitor structure 121.

Figure 4:
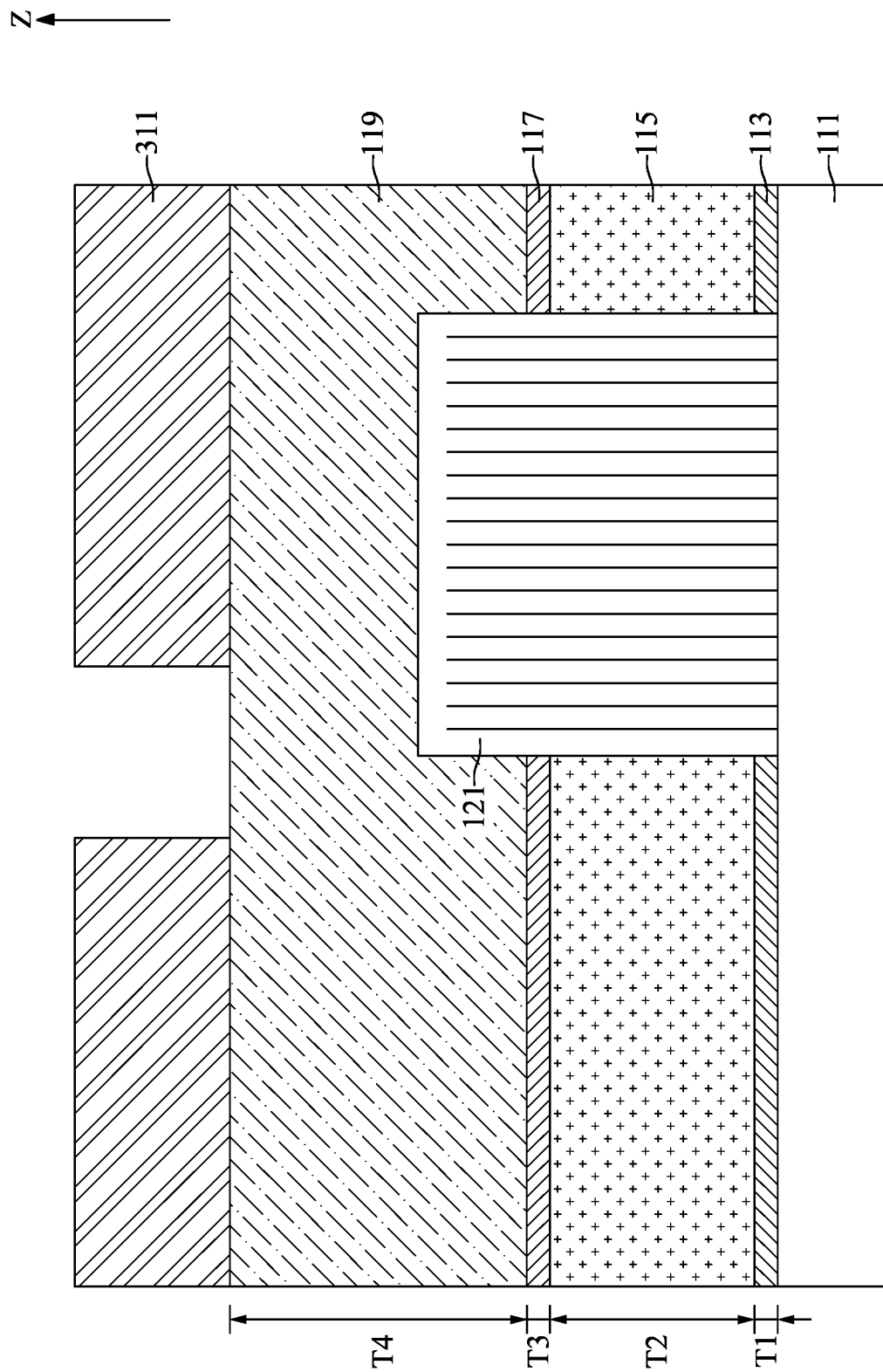

With reference to FIG. 4, the second dielectric layer 119 may be formed on the higher dielectric layer 117. In some embodiments, the second dielectric layer 119 may be referred to as part of the dielectric layer of the first substrate 111.

In some embodiments, the second dielectric layer 119 may be formed of a material having etching selectivity to the higher dielectric layer 117. In some embodiments, the second dielectric layer 119 may be formed of the same material as the first dielectric layer 115. In some embodiments, the second dielectric layer 119 may be formed of, for example, silicon oxide, borophosphosilicate glass, undoped silicate glass, fluorinated silicate glass, low-k dielectric materials such as a spin-on low-k dielectric layer or a chemical vapor deposition low-k dielectric layer, or a combination thereof. In some embodiments, the second dielectric layer 119 may include a self-planarizing material such as a spin-on glass or a spin-on low-k dielectric material such as SiLK™. The use of a self-planarizing dielectric material may avoid the need to perform a subsequent planarizing step.

In some embodiments, the second dielectric layer 119 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps. In the present embodiment, the second dielectric layer 119 is formed of silicon oxide. In some embodiments, the second dielectric layer 119 may consist essentially of silicon oxide.

With reference to FIG. 4, in some embodiments, the thickness T4 of the second dielectric layer 119 and the thickness T2 of the first dielectric layer 115 may be substantially the same. In some embodiments, the thickness T4 of the second dielectric layer 119 may be greater than the thickness T2 of the first dielectric layer 115. In some embodiments, the thickness T4 of the second dielectric layer 119 may be greater than the thickness T1 of the lower dielectric layer 113 or the thickness T3 of the higher dielectric layer 117.

With reference to FIG. 4, a first mask layer 311 may be formed on the second dielectric layer 119. The first mask layer 311 may include the pattern of the contact opening CO. In some embodiments, the first mask layer 311 may be a photoresist layer.

Figure 5:
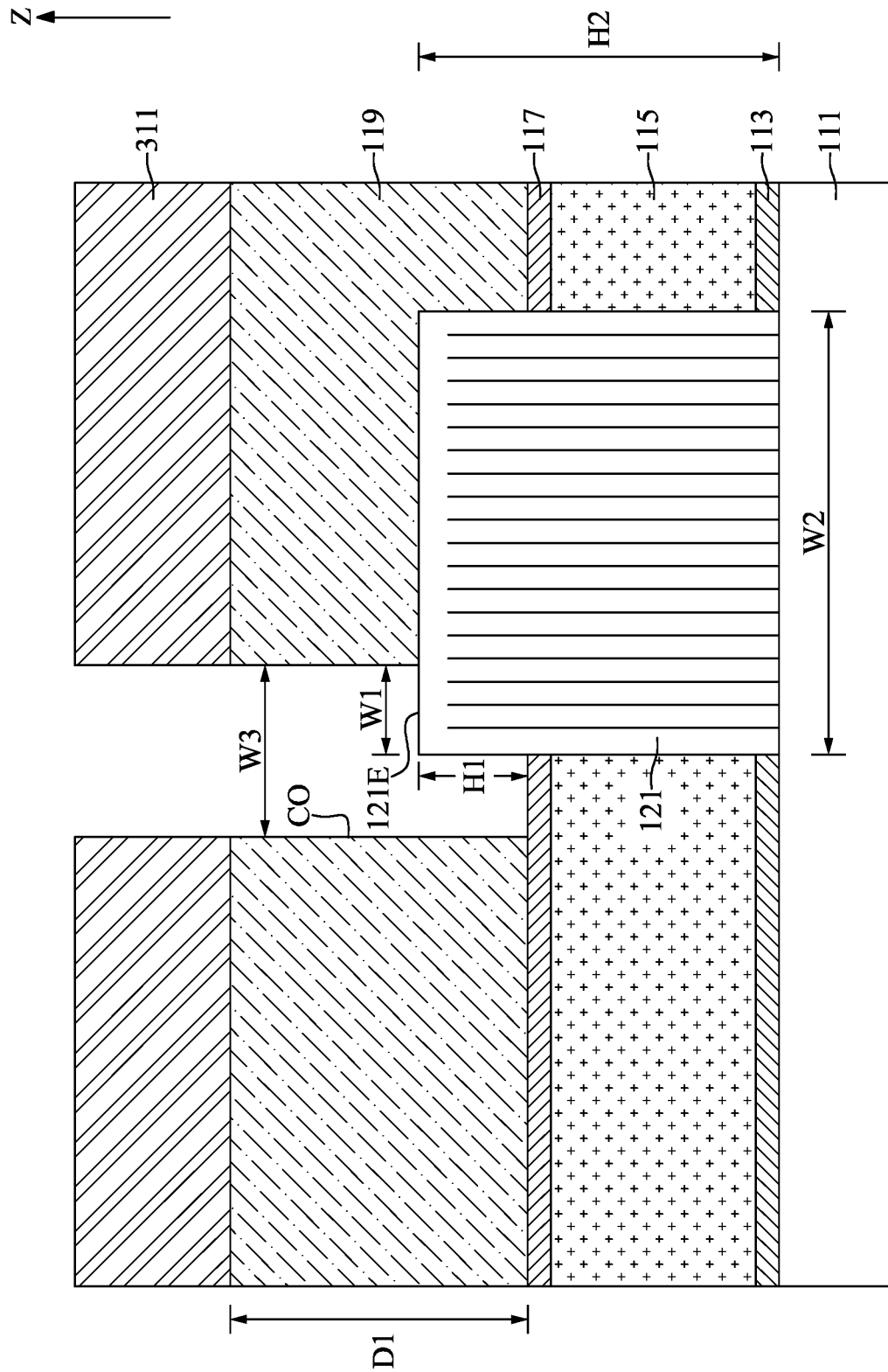

With reference to FIG. 5, an opening etching process may be performed using the first mask layer 311 as the mask to remove a portion of the second dielectric layer 119. In some embodiments, the etch rate ratio of the second dielectric layer 119 to the first mask layer 311 may be between about 100:1 and about 1.05:1, between about 15:1 and about 2:1, or between about 10:1 and about 2:1 during the opening etching process. In some embodiments, the etch rate ratio of the second dielectric layer 119 to the top plate of the capacitor structure 121 may be between about 100:1 and about 1.05:1, between about 15:1 and about 2:1, or between about 10:1 and about 2:1 during the opening etching process. In some embodiments, the etch rate ratio of the second dielectric layer 119 to the higher dielectric layer 117 may be between about 100:1 and about 1.05:1, between about 15:1 and about 2:1, or between about 10:1 and about 2:1 during the opening etching process. After the opening etching process, the first mask layer 311 may be removed.

With reference to FIG. 5, after the opening etching process, a corner of the top plate of the capacitor structure 121 may be exposed through the contact opening CO. The corner of the top plate of the capacitor structure 121 being exposed may be referred to as the exposed portion 121E. The ratio of the width W1 of the exposed portion 121E and the width W2 of the capacitor structure 121 may be between about 0.05 and about 0.30. The ratio of the height H1 of the exposed portion 121E to the height H2 of the capacitor structure 121 may be between about 0.005 and about 0.10.

With reference to FIG. 5, in some embodiments, the ratio of the width W1 of the exposed portion 121E to the width W3 of the contact opening CO may be between about 0.3 and about 0.7, or between about 0.4 and about 0.6. In some embodiments, the ratio of the height H1 of the exposed portion 121E to the depth D1 of the contact opening CO may be between about 0.02 and about 0.40.

It should be noted that, in the description of the present disclosure, the term "selectively depositing a layer on a first feature over a second feature", and the like, means that a first amount of the layer is deposited on the first feature and a second amount of the layer is deposited on the second feature, where the first amount of the layer is greater than the second amount of the layer, or no layer is deposited on the second feature. The selectivity of a deposition process may be expressed as a multiple of growth rate. For example, if one surface is deposited on twenty-five times faster than a different surface, the process would be described as having a selectivity of 25:1 or simply 25. In this regard, higher ratios indicate more selective deposition processes.

The term "over" used in this regard does not imply a physical orientation of one feature on top of another feature, rather a relationship of the thermodynamic or kinetic properties of the chemical reaction with one feature relative to the other feature. For example, selectively depositing a cobalt layer onto a metal surface over a dielectric surface means that the cobalt layer deposits on the metal surface and less or no cobalt layer deposits on the dielectric surface; or that the formation of a cobalt layer on the metal surface is thermodynamically or kinetically favorable relative to the formation of a cobalt layer on the dielectric surface.

Figure 6:
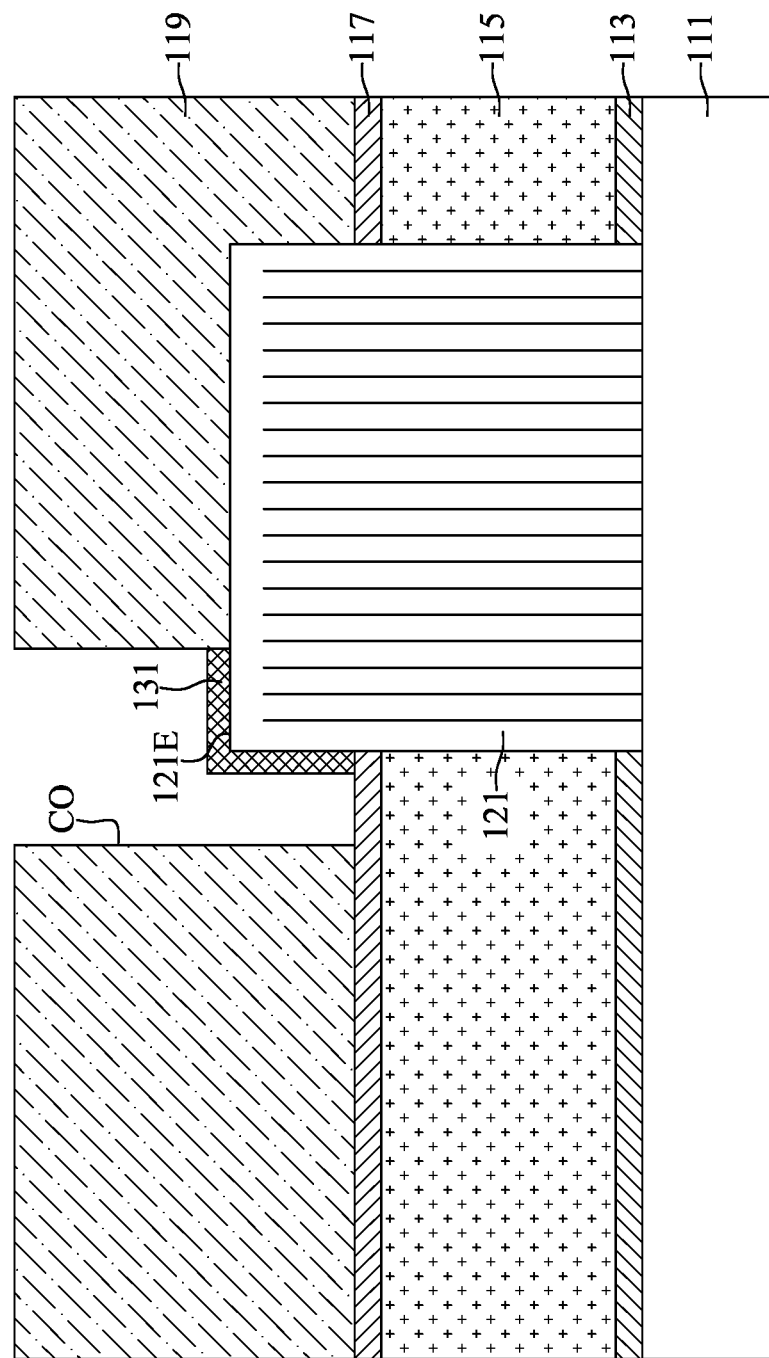

With reference to FIG. 6, the assistant layer 131 may be conformally and selectively deposited on the exposed portion 121E over the higher dielectric layer 117 and over the second dielectric layer 119. In some embodiments, the assistant layer 131 may be formed of, for example, germanium. In some embodiments, the assistant layer 131 may include an atomic percentage of germanium greater than or equal to 50%. In this regard, the assistant layer 131 may be described as a "germanium-rich layer". In some embodiments, the atomic percentage of germanium in the assistant layer 131 may be greater than or equal to 60%, greater than or equal to 70%, greater than or equal to 80% greater than or equal to 90%, greater than or equal to 95%, greater than or equal to 98%, greater than or equal to 99% or greater than or equal to 99.5%. Stated differently, in some embodiments, the assistant layer 131 consists essentially of germanium. In some embodiments, the assistant layer 131 comprises silicon and germanium. Stated differently, in some embodiments, the assistant layer 131 may include silicon germanium.

In some embodiments, the assistant layer 131 may be formed by a deposition process. In some embodiments, the deposition process may include a reactive gas including a germanium precursor and/or hydrogen gas. In some embodiments, the germanium precursor may consist essentially of germane. In some embodiments, the germanium precursor may include one or more of germane, digermane, isobutylgermane, chlorogermane, or dichlorogermane. In some embodiments, the hydrogen gas may be used as a carrier or diluent for the germanium precursor. In some embodiments, the reactive gas may consist essentially of germane and hydrogen gas. In some embodiments, the molar percentage of germane in the reactive gas may be in a range of about 1% to about 50%, in a range of about 2% to about 30%, or in a range of about 5% to about 20%.

Alternatively, in some embodiments, the reactive gas may further include a silicon containing precursor. In some embodiments, the silicon containing precursor may include one or more of silane, a polysilane, or a halosilane. As used in this regard, a "polysilane" is a species with the general formula $Si_nH_{2n+2}$ where n is 2 to 6. Further, a "halosilane" is a species with the general formula $Si_aX_bH_{2a+2-b}$ where X is a halogen, a is 1 to 6, and b is 1 to 2a+2. In some embodiments, the silicon containing precursor comprises one or more of $SiH_4$, $Si_2H_6$, $Si_3H_8$, $Si_4H_{10}$, $SiCl_4$, or $SiH_2Cl_2$.

In some embodiments, the temperature of the intermediate semiconductor device to be deposited may be maintained during the deposition process. The temperature may be referred to as the substrate temperature. In some embodiments, the substrate temperature may be in a range between about 300° C. and about 800° C., between about 400° C. and about 800° C., between about 500° C. and about 800° C., between about 250° C. and about 600° C., between about 400° C. and about 600° C., or between about 500° C. and about 600° C. In some embodiments, the substrate temperature may be about 540° C.

In some embodiments, the pressure of the processing chamber for depositing the assistant layer 131 may be maintained during the deposition process. In some embodiments, the pressure is maintained in a range between about 1 Torr and about 300 Torr, between about 10 Torr and about 300 Torr, between about 50 Torr and about 300 Torr, between about 100 Torr and 300 Torr, between about 200 Torr and about 300 Torr, or between about 1 Torr and about 20 Torr. In some embodiments, the pressure may be maintained at about 13 Torr.

In some embodiments, the selectivity of the deposition may be greater than or equal to 5, greater than or equal to 10, greater than or equal to 20, greater than or equal to 30, or greater than or equal to 50. In some embodiments, the assistant layer 131 may be deposited on the exposed portion 121E to a thickness before deposition is observed on the higher dielectric layer 117 and the second dielectric layer 119. In some embodiments, greater than 50 nm, greater than 100 nm, greater than 150 nm, greater than 200 nm or greater than 250 nm of the assistant layer 131 may be deposited on the exposed portion 121E before 5 nm of assistant layer 131 is deposited on the higher dielectric layer 117 and the second dielectric layer 119.

With reference to FIG. 1 and FIGS. 7 to 9, at step S17, a contact structure 140 may be formed in the contact opening CO.

Figure 7:
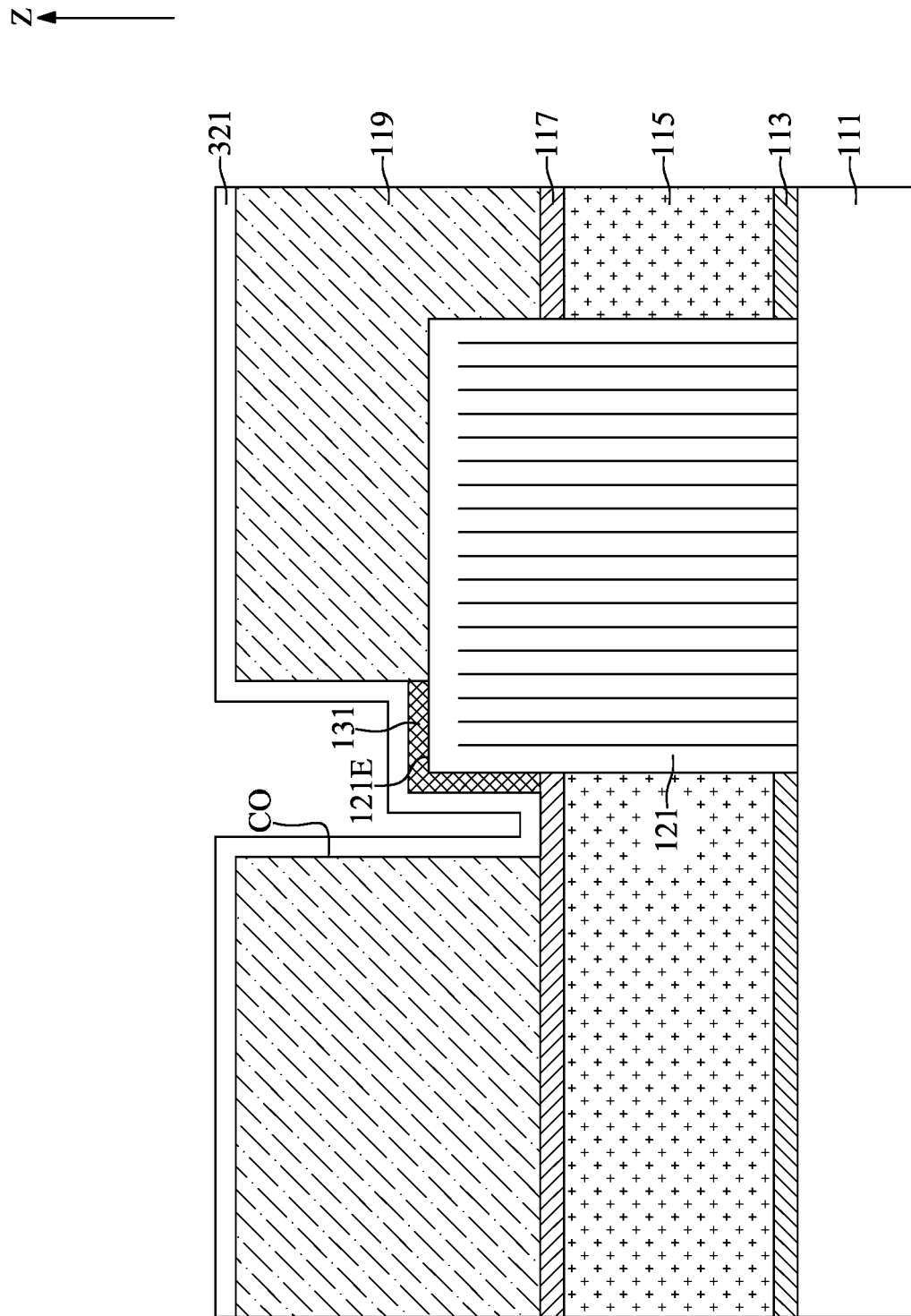

With reference to FIG. 7, a layer of barrier material 321 may be conformally formed on the second dielectric layer 119, in the word line trenches 501, and on the exposed portion 121E. In some embodiments, the layer of barrier material 321 may be formed by, for example, atomic layer deposition. The layer of barrier material 321 may prevent metal ion in the contact conductive layer 143, which will be illustrated later, diffusing into the second dielectric layer 119 and may improve the adhesion between the second dielectric layer 119 and the contact conductive layer 143. In some embodiments, the barrier material 321 may include, for example, titanium nitride. In some embodiments, the layer of barrier material 321 may include a columnar grain structure.

Figure 8:
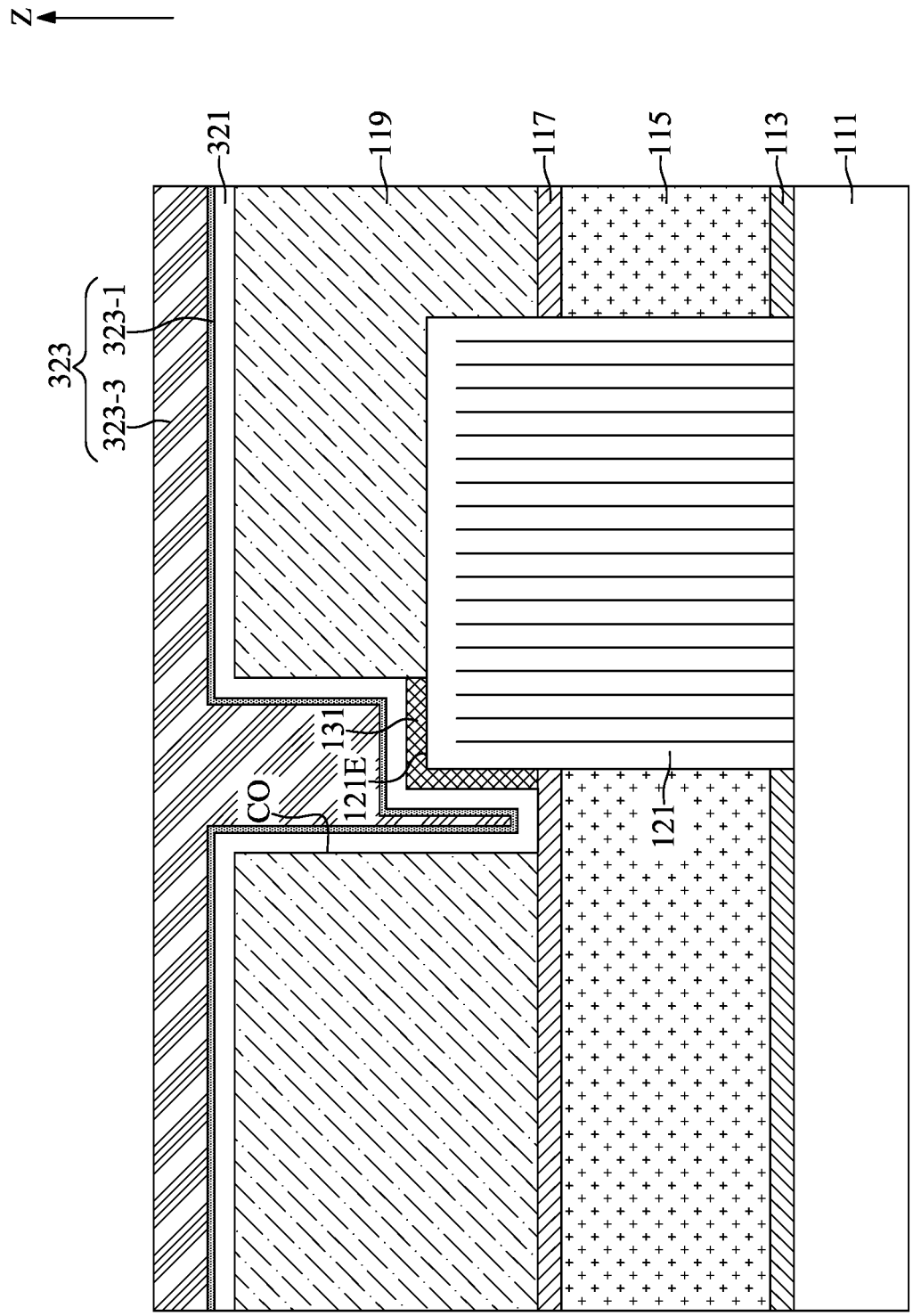

With reference to FIG. 8, a nucleation layer 323-1 may be conformally formed on the layer of barrier material 321 and a bulk layer 323-3 may be formed on the nucleation layer 323-1, wherein the nucleation layer 323-1 and the bulk layer 323-3 together configure a layer of filler material 323.

With reference to FIG. 8, the nucleation layer 323-1 and the bulk layer 323-3 may include tungsten. Tungsten may be particularly useful in gate electrodes and word and bit lines in dynamic random access memory types of integrated circuit devices because of its thermal stability during subsequent high temperature processes, where processing temperatures may reach 900° C. or more. Additionally, tungsten is a highly refractive material which offers good oxidation resistance and lower resistivity.

In some embodiments, the nucleation layer 323-1 may be a thin conformal layer that serves to facilitate the subsequent formation of a bulk material (i.e., the bulk layer 323-3) thereon. Conforming to the underlying layer of barrier material 321 may be critical to support high quality deposition. In some embodiments, the nucleation layer 323-1 may be formed by a pulsed nucleation layer method.

In the pulsed nucleation layer method, pulses of reactant (e.g., reducing agent or precursor) may be sequentially injected and purged from the reaction chamber, typically by a pulse of a purge gas between reactants. A first reactant may be adsorbed onto the substrate (e.g., the layer of barrier material 321), available to react with the next reactant. The process is repeated in a cyclical fashion until the desired thickness is achieved. It should be noted that, the pulsed nucleation layer method may be generally distinguished from atomic layer deposition by its higher operating pressure range (greater than 1 Torr) and its higher growth rate per cycle (greater than 1 monolayer film growth per cycle). The chamber pressure during the pulsed nucleation layer method may range from about 1 Torr to about 400 Torr.

In some embodiments, the reactants of forming the nucleation layer 323-1 may be, for example, a silicon-containing reducing agent and a tungsten-containing precursor. The layer of barrier material 321 may be initially exposed to the silicon-containing reducing agent and followed by exposure to the tungsten-containing precursor to form the nucleation layer 323-1. The exposure to the silicon-containing reducing agent and the tungsten-containing precursor may be defined as a cycle and may be repeated until the desired thickness of the nucleation layer 323-1 is achieved.

Silane and related compounds have been found to adsorb well to metal nitride surfaces such as titanium nitride and tungsten nitride used as barrier layer materials in some integrated circuit applications. Any suitable silane or silane derivative may be used as the silicon-containing reducing agent, including organic derivatives of silanes. It is generally understood that silanes adsorb on the substrate surface in a self-limiting manner to create nominally a monolayer of silane species. Thus, the amount of adsorbed species is largely independent of the silane dosage.

In some embodiments, the substrate temperature during the exposure to the silicon-containing reducing agent may be between about 200° C. and about 475° C., between about 300° C. and about 400° C., or about 300° C. In some embodiments, the chamber pressure during exposure to the silicon-containing reducing agent may be between about 1 Torr and about 350 Torr or be fixed around 40 Torr. The exposure time (or pulse time) may vary depending in part upon dosages and chamber conditions. In some embodiments, the layer of barrier material 321 is exposed until the surface is sufficiently and evenly covered with at least a saturated layer of silane species. In some embodiments, the silicon-containing reducing agent may be provided alone. In some embodiments, the silicon-containing reducing agent may be provided with a carrier gas such as argon or argon-hydrogen mixtures.

In some embodiments, once the layer of barrier material 321 is sufficiently covered with silane species, the flow of the silicon-containing reducing agent may be stopped. A purge process may be performed to clear residual gas reactants near the surface of the layer of barrier material 321. The purge process may be performed with a carrier gas such as argon, hydrogen, nitrogen, or helium.

In some embodiments, the tungsten-containing precursor may include tungsten hexafluoride, tungsten hexachloride, or tungsten hexacarbonyl. In some embodiments, the tungsten-containing precursor may include organo-metallic compounds that are free of fluorine, such as MDNOW (methylcyclopentadienyl-dicarbonylnitrosyl-tungsten) and EDNOW (ethylcyclopentadienyl-dicarbonylnitrosyl-tungsten). In some embodiments, the tungsten-containing precursor may be provided in a dilution gas, accompanying with gases such as argon, nitrogen, hydrogen, or a combination thereof.

In some embodiments, the substrate temperature during exposure to the tungsten-containing precursor may be between about 200° C. and about 475° C., between about 300° C. and about 400° C., or about 300° C. In some embodiments, the chamber pressure during exposure to the tungsten-containing precursor may be between about 1 Torr and about 350 Torr. Tungsten-containing precursor dosage and substrate exposure time (or pulse time) will vary depending upon many factors. In general, the exposure may be performed until the adsorbed silane species is sufficiently consumed by reaction with the tungsten-containing precursor to produce the nucleation layer 323-1. Thereafter, the flow of tungsten-containing precursor may be stopped, and a purge process may be performed with a carrier gas such as argon, hydrogen, nitrogen, or helium.

Alternatively, in some embodiments, the reactants of forming the nucleation layer 323-1 may be, for example, a boron-containing reducing agent and the tungsten-containing precursor. The layer of barrier material 321 may be initially exposed to the boron-containing reducing agent and followed by exposure to the tungsten-containing precursor to form the nucleation layer 323-1. The exposure to the boron-containing reducing agent and the tungsten-containing precursor may be defined as a cycle and may be repeated until the desired thickness of the nucleation layer 323-1 is achieved.

In some embodiments, the boron-containing reducing agent may be, for example, borane, diborane, triborane, or boron halides (e.g., BF3, BCl3) with hydrogen. The tungsten-containing precursor may be material similar to the tungsten-containing precursor mentioned above, and descriptions thereof are not repeated herein. In some embodiments, the boron-containing reducing agent may be provided in a dilution gas, accompanying with gases such as argon, nitrogen, hydrogen, silane, or a combination thereof. For example, diborane may be provided from a diluted source (e.g., 5% diborane and 95% nitrogen). In some embodiments, the substrate temperature during exposure to the boron-containing reducing agent may be between about 200° C. and about 475° C., between about 300° C. and about 400° C., or about 300° C. In some embodiments, the chamber pressure during exposure to the boron-containing reducing agent may be between about 1 Torr and about 350 Torr. In some embodiments, once the boron-containing reducing agent is deposited to a sufficient thickness, the flow of boron-containing reducing agent may be stopped. A purge process may be performed with a carrier gas such as argon, hydrogen, nitrogen, or helium.

After exposure to the boron-containing reducing agent, the intermediate semiconductor device may be then exposed to the tungsten-containing precursor. The process is similar to that exposure to the tungsten-containing precursor after exposing to the silicon-containing reducing agent, and descriptions thereof are not repeated herein.

In some embodiments, a pre-treatment may be performed to the layer of barrier material 321 before forming the nucleation layer 323-1 using exposure to the boron-containing reducing agent and the tungsten-containing precursor. The pre-treatment may include diborane.

In some embodiments, exemplary data reveals that the diborane-based nucleation layer 323-1 may produce tungsten with greater grain size in the initial stage of forming the nucleation layer 323-1. In contrast, the silane-based nucleation layer 323-1 may produce tungsten with smaller grain size in the initial stage of forming the nucleation layer 323-1. That is, the deposited bulk layer 323-3 form on the silane-based nucleation layer 323-1 may have less or no defects such as seam and void.

Alternatively, the nucleation layer 323-1 may be formed by being sequentially exposed to the silicon-containing reducing agent, the tungsten-containing precursor, the boron-containing reducing agent, and the tungsten-containing precursor. The four steps of exposure may be defined as a cycle. The entire four-step cycle may be repeated to form the nucleation layer 323-1 with the desired thickness. In a variation of the process, the first two steps of the cycle (sequential exposure to the silicon-containing reducing agent and the tungsten-containing precursor) may be repeated one or more time prior to contact with the boron-containing reducing agent. In another variation, the last two steps of the cycle (sequential exposure to the boron-containing reducing agent and the tungsten-containing precursor) may be repeated one or more times after the first two steps are completed.

Alternatively, in some embodiments, the reactants of forming the nucleation layer 323-1 may be, for example, a germanium-containing reducing agent and the tungsten-containing precursor. The layer of barrier material 321 may be initially exposed to the germanium-containing reducing agent and followed by exposure to the tungsten-containing precursor to form the nucleation layer 323-1. In some embodiments, the germanium-containing reducing agent may be a germane such as $Ge_nH_{n+4}$, $Ge_nH_{n+6}$, $Ge_nH_{n+8}$, and $Ge_nH_m$, where n is an integer from 1 to 10, and n is a different integer than m. Other germanium-containing compounds may also be used, for example, alkyl germanes, alkyl germanium, aminogermanes, carbogermanes, and halogermane. The tungsten-containing precursor may be material similar to the tungsten-containing precursor mentioned above, and descriptions thereof are not repeated herein.

An exemplary process for forming the nucleation layer 323-1 may be illustrated as follows.

Firstly, the intermediate semiconductor device illustrated in FIG. 7 may be exposed to pulses of the germanium-containing reducing agent in a hydrogen environment to form a layer of germanium on the layer of barrier material 321. In some embodiments, the hydrogen-to-germanium-containing reducing agent ratio may be about 10:1, about 50:1, about 70:1, or about 100:1. The presence of hydrogen may decrease the thickness deposited per cycle, as well as decrease the resistivity of the deposited bulk layer 323-3.

In some embodiments, pulses of one or more additional reducing agents, such as pulses of the boron-containing or silicon-containing reducing agent, may be used. The additional reducing agents may be pulsed sequentially or simultaneously with the germanium-containing reducing agent. In some embodiments, interval time pauses between pulses may be between about 0.5 seconds and about 5 seconds. In some embodiments, the pulses of germanium-containing reducing agent may be optional, only the pulses of the boron-containing or silicon-containing reducing agent may be used.

In some embodiments, the duration of pulse (or pulse time) may be between about 0.25 seconds and about 30 seconds, between about 0.25 seconds and about 5 seconds, or between about 0.5 seconds and about 3 seconds. The pulse may be sufficient to saturate or oversaturate the surface of the layer of barrier material 321. In some embodiments, a carrier gas may be used, such as argon, helium, or nitrogen. In some embodiments, an optional purge process may be performed to purge excess germanium-containing reducing agent still in gas phase that did not adsorb to the surface of the layer of barrier material 321. The purge process may be conducted by flowing an inert gas at a fixed pressure thereby reducing the pressure of the chamber and re-pressurizing the chamber before initiating another gas exposure.

Next, the intermediate semiconductor device may be exposed to pulses of the tungsten-containing precursor. The tungsten-containing precursor reacts with the deposited layer of germanium to form elemental tungsten. In some embodiments, the duration of pulse (or pulse time) may be between about 0.25 seconds and about 30 seconds, between about 0.25 seconds to about 5 seconds, or between about 0.5 seconds to about 3 seconds. The pulse may be sufficient to react with the reactive sites on the surface of the layer of barrier material 321 where germanium adsorbs onto the surface. In some embodiments, the interval time pauses between pulses may be between about 0.5 seconds and about 5 seconds.

In some embodiments, a carrier gas may be used, such as argon, helium, or nitrogen. In some embodiments, exposure to the tungsten-containing precursor may be performed in a hydrogen environment. In some embodiments, an optional purge process may be performed to purge excess tungsten-containing precursor still in the gas phase that did not react to the germanium adsorbed onto the surface of the layer of barrier material 321. The purge process may be conducted by flowing an inert gas at a fixed pressure thereby reducing the pressure of the chamber and re-pressurizing the chamber before initiating another gas exposure.

Finally, exposure to the pulses of the germanium-containing reducing agent and the tungsten-containing precursor may be repeated until a desired thickness of the nucleation layer 323-1 is deposited on the surface of the layer of barrier material 321. Each repetition of exposure to the pulses of the germanium-containing reducing agent and the tungsten-containing precursor may be referred to as a cycle.

In some embodiments, the order of exposure to the pulses of the germanium-containing reducing agent and the tungsten-containing precursor may be reversed, such that the tungsten-containing precursor is pulsed first.

With reference to FIG. 8, the bulk layer 323-3 may be formed on the nucleation layer 323-1 and completely fill the contact opening CO. The bulk layer 323-3 may be formed by, for example, physical vapor deposition, atomic layer deposition, molecular layer deposition, chemical vapor deposition, in-situ radical assisted deposition, metalorganic chemical vapor deposition, molecular beam epitaxy, sputtering, plating, evaporation, ion beam deposition, electron beam deposition, laser assisted deposition, chemical solution deposition, or any combination thereof.

For example, the deposition of the bulk layer 323-3 using chemical vapor deposition may include flowing (or introducing) a tungsten-containing precursor and a co-reactant such as a reducing agent to the intermediate semiconductor device including the nucleation layer 323-1. Example process pressure may be between about 10 Torr and about 500 Torr. Example substrate temperature may be between about 250° C. and about 495° C. The tungsten-containing precursor may be, for example, tungsten hexafluoride, tungsten chloride, or tungsten hexacarbonyl. The reducing agent may be, for example, hydrogen gas, silane, disilane, hydrazine, diborane, or germane.

In some embodiments, the grain size of tungsten of the bulk layer 323-3 may be greater than 30 nm, than 50 nm, than 70 nm, than nm, than 85 nm, or than 87 nm. In some embodiments, the bulk layer 323-3 may include alpha phase tungsten.

Figure 9:
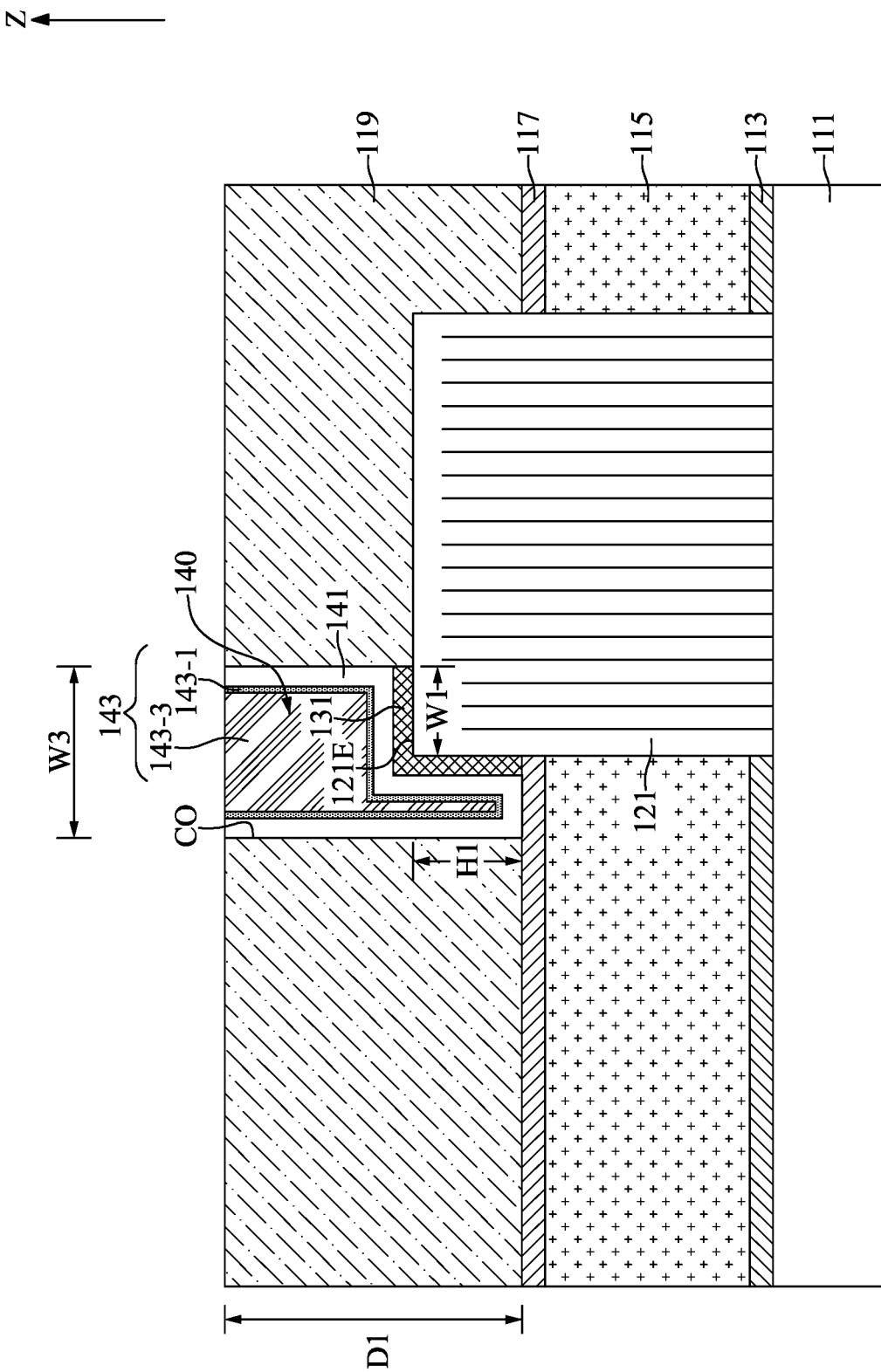

With reference to FIG. 9, a planarization process, such as chemical mechanical polishing, may be performed until the top surface of the second dielectric layer 119 is exposed to remove excess material, provide a substantially flat surface for subsequent processing steps. After the planarization process, the remaining layer of barrier material 321 may be turned into a contact barrier layer 141 in the contact opening CO and on the exposed portion 121E of the capacitor structure 121. The remaining nucleation layer 323-1 may be turned into a nucleation portion 143-1 on the contact barrier layer 141. The remaining bulk layer 323-3 may be turned into a bulk portion 143-3 on the nucleation portion 143-1 and completely filling the contact opening CO. The nucleation portion 143-1 and the bulk portion 143-3 together configure the contact conductive layer 143 on the contact barrier layer 141. The contact conductive layer 143 may completely fill the contact opening CO. The contact barrier layer 141 and the contact conductive layer 143 together configure the contact structure 140.

With reference to FIG. 9, the dimension of the contact structure 140 may be determined by the contact opening CO. That is, the contact structure 140 may also have the width W3 and the depth D1. In some embodiments, the ratio of the width W1 of the exposed portion 121E to the width W3 of the contact structure 140 may be between about 0.3 and about 0.7, or between about 0.4 and about 0.6. In some embodiments, the ratio of the height H1 of the exposed portion 121E to the depth D1 of the contact structure 140 may be between about 0.02 and about 0.40.

Figure 10:
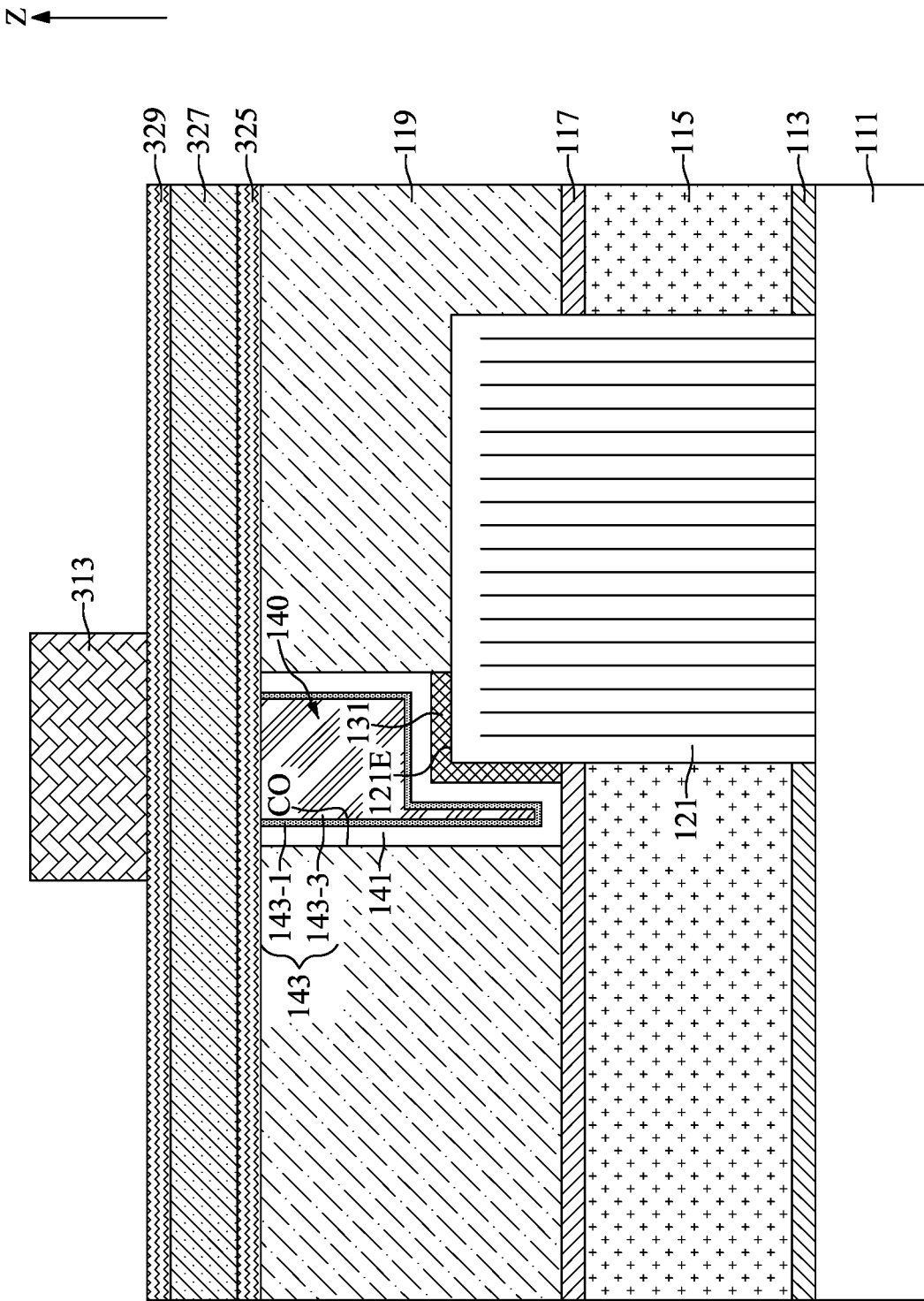
Figure 11:
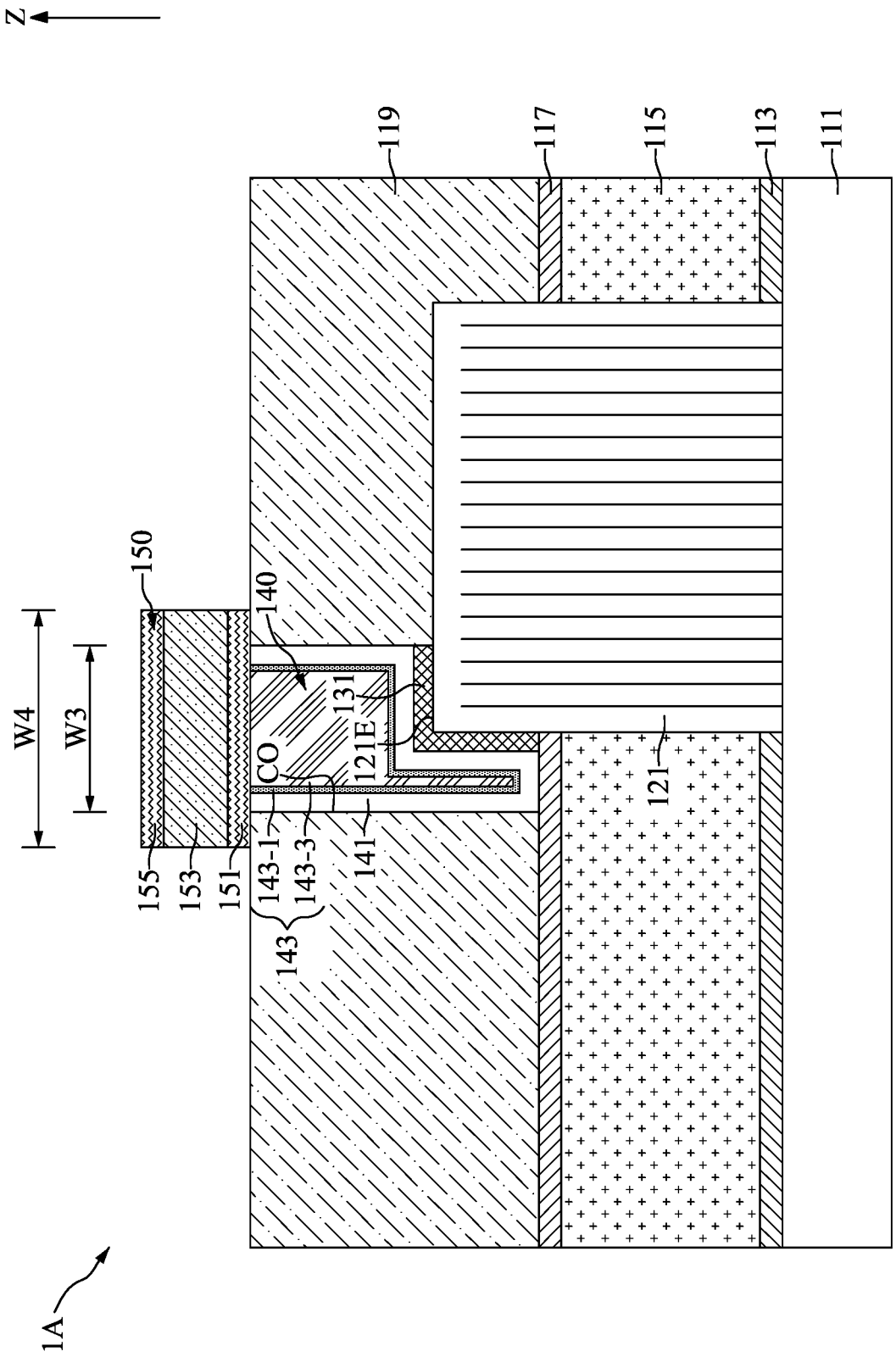

With reference to FIGS. 1, 10, and 11, at step S19, a bonding structure 150 may be formed on the contact structure 140.

With reference to FIG. 10, a layer of first conductive material 325 may be formed on the second dielectric layer 119. In some embodiments, the first conductive material 325 may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In the present embodiment, the first conductive material 325 is titanium. In some embodiments, the layer of first conductive material 325 may be formed by, for example, chemical vapor deposition, physical vapor deposition, sputtering, electroplating, or electroless plating.

With reference to FIG. 10, a layer of second conductive material 327 may be formed on the layer of first conductive material 325. In some embodiments, the second conductive material 327 may be, for example, metal alloy (e.g., aluminum copper alloy), copper, aluminum, or other applicable conductive material. In the present embodiment, the second conductive material 327 is aluminum copper alloy. In some embodiments, the layer of second conductive material 327 may be formed by, for example, physical vapor deposition, sputtering, electroplating, electroless plating, or other applicable process.

With reference to FIG. 10, a layer of third conductive material 329 may be formed on the layer of second conductive material 327. In some embodiments, the third conductive material 329 may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In the present embodiment, the third conductive material 329 is titanium nitride. In some embodiments, the layer of third conductive material 329 may be formed by, for example, chemical vapor deposition, physical vapor deposition, or other applicable deposition process.

With reference to FIG. 10, the second mask layer 313 may be formed on the layer of third conductive material 329. The second mask layer 313 may have the pattern of the bonding structure 150. In some embodiments, the second mask layer 313 may be a photoresist layer.

With reference to FIG. 11, an etching process may be performed to remove portions of the first conductive material 325, portions of the second conductive material 327, and portions of the third conductive material 329. In some embodiments, the etch rate ratio of the first conductive material 325 to the second mask layer 313 may be between about 100:1 and about 1.05:1, between about 15:1 and about 2:1, or between about 10:1 and about 2:1 during the etching process. In some embodiments, the etch rate ratio of the second conductive material 327 to the second mask layer 313 may be between about 100:1 and about 1.05:1, between about 15:1 and about 2:1, or between about 10:1 and about 2:1 during the etching process. In some embodiments, the etch rate ratio of the third conductive material 329 to the second mask layer 313 may be between about 100:1 and about 1.05:1, between about 15:1 and about 2:1, or between about 10:1 and about 2:1 during the etching process.

With reference to FIG. 10, after the etching process, the remaining first conductive material 325 may be turned into a bottom conductive layer 151. The remaining second conductive material 327 may be turned into the middle conductive layer 153. The remaining third conductive material 329 may be turned into the top conductive layer 155. The bottom conductive layer 151, the middle conductive layer 153, and the top conductive layer 155 together configure the bonding structure 150. In some embodiments, the width W4 of the bonding structure 150 may be greater than the width W3 of the contact structure 140.

By employing the assistant layer 131 formed on the exposed portion 121E of the capacitor structure 121, the resistance of the capacitor structure 121 may be reduced. As a result, the exposed area of the capacitor structure 121 may be further reduced which indicates the overlay window between the contact structure 140 to the capacitor structure 121 may be increased.

FIGS. 12 to 15 illustrate, in schematic cross-sectional view diagrams, a flow for fabricating a semiconductor device 1B in accordance with another embodiment of the present disclosure.

Figure 12:
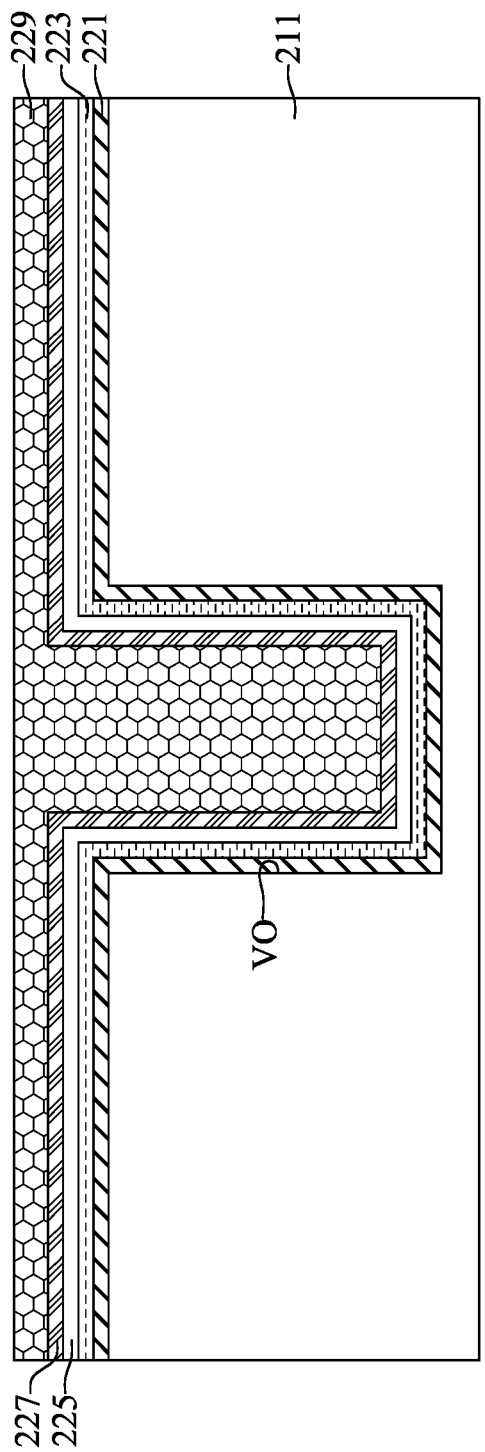
FIGS. 12 to 15 illustrate, in schematic cross-sectional view diagrams, a flow for fabricating a semiconductor device in accordance with another embodiment of the present disclosure.

With reference to FIG. 12, a second substrate 211 may be provided. In some embodiments, the first substrate 111 may include a bulk semiconductor substrate that is composed entirely of at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

With G. 12, a via opening VO may be formed in the second substrate 211. An isolation layer 221 may be conformally formed on the second substrate 211 and in the via opening VO. In some embodiments, the isolation layer 221 may be formed of, for example, silicon oxide, silicon nitride, silicon oxynitride, or tetra-ethyl ortho-silicate. The isolation layer 221 may have a thickness between about 50 nm and about 200 nm. Alternatively, in some embodiments, the isolation layer 221 may be formed of, for example, parylene, epoxy, or poly(p-xylene). The isolation layer 221 may have a thickness between about 1 μm and about 5 μm. The isolation layer 221 may ensure the filler layer 229, which will be illustrated later, is electrically isolated.

With reference to FIG. 12, a barrier layer 223 may be conformally formed on the isolation layer 221 and in the via opening VO. The barrier layer 223 may be formed of, for example, tantalum, tantalum nitride, titanium, titanium nitride, rhenium, nickel boride, or tantalum nitride/tantalum bilayer. The barrier layer 223 may inhibit diffusion of the conductive materials of the filler layer 229. The barrier layer 223 may be formed by deposition process such as physical vapor deposition, atomic layer deposition, chemical vapor deposition, sputtering, or other applicable deposition process.

With reference to FIG. 12, an adhesive layer 225 may be conformally formed on the barrier layer 223. The adhesive layer 225 may be electrically coupled to the barrier layer 223. The adhesive layer 225 may be formed of, for example, titanium, tantalum, titanium tungsten, or manganese nitride. The adhesive layer 225 may improve an adhesion between a seed layer 227, which will be illustrated later, and the barrier layer 223. The adhesive layer 225 may have a thickness between about 5 nm and about 50 nm. The adhesive layer 225 may be formed by a deposition process such as physical vapor deposition, atomic layer deposition, chemical vapor deposition, sputtering, or other applicable deposition process.

With reference to FIG. 12, the seed layer 227 may be conformally formed on the adhesive layer 225. The seed layer 227 may be electrically coupled to the adhesive layer 225. The seed layer 227 may have a thickness between about 10 nm and about 40 nm. The seed layer 227 may be formed of, for example, copper or ruthenium. The seed layer 227 may be formed by a deposition process such as physical vapor deposition, atomic layer deposition, chemical vapor deposition, sputtering, or other applicable deposition process. The seed layer 227 may reduce resistivity of the via opening VO during the formation of the filler layer 229 by an electroplating process.

With reference to FIG. 12, the filler layer 229 may be formed on the seed layer 227 and completely fill the via opening VO. The filler layer 229 may be formed of, for example, copper. The filler layer 229 may be formed by an electroplating process using a plating solution. The plating solution may include copper sulfate, copper methane sulfonate, copper gluconate, copper sulfamate, copper nitrate, copper phosphate, or copper chloride. The pH of the plating solution may be between about 2 and about 6 or between about 3 and about 5. The process temperature of the electroplating process may be maintained between about 40° C. and about 75° C. or between about 50° C. and about 70° C.

In some embodiments, the plating solution may include accelerators, suppressors, or levelers. The accelerators may include a polar sulfur, oxygen, or nitrogen functional group that help to increase deposition rates and may promote dense nucleation. The accelerators may be present at a low concentration level, for example, between about 0 and about 200 ppm. The suppressors are additives that reduce the plating rate and are usually present in the plating bath at higher concentrations, for example, between about 5 ppm and about 1000 ppm. The suppressors may be polymeric surfactants with high molecular weight, such as polyethylene glycol.

The suppressors may slow down the deposition rate by adsorbing on the surface and forming a barrier layer to the copper ions. Because of their large size and low diffusion rate, the suppressors are less likely to reach the lower part of the via opening VO. Therefore, most of suppressing effect may occur at the upper part of the via opening VO, helping to reduce overburden of the filling material (e.g., copper) and avoid the via opening VO "closing."

The leveler may be used to improve filling performance, decrease the surface roughness, and prevent copper deposition at the upper part of the via opening VO. The levelers may be present in a small concentration, for example, between about 1 ppm and about 100 ppm. The levelers may be, for example, 3-mercapto-1-propanesulfonate, (3-sulfopropyl) disulfide, or 3,3-thiobis (1-propane sulfonate).

Figure 13:
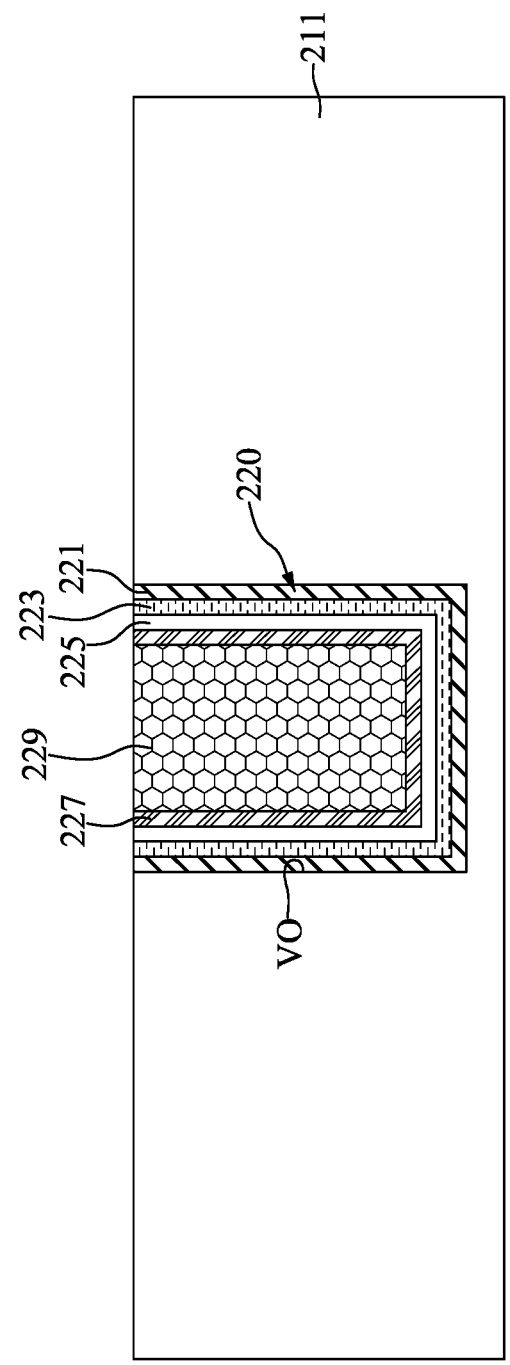

With reference to FIG. 13, a planarization process, such as chemical mechanical polishing, may be performed until the top surface of the second substrate 211 is exposed to remove excess material, provide a substantially flat surface for subsequent processing steps. After the planarization process, the isolation layer 221, the barrier layer 223, the adhesive layer 225, the seed layer 227, and the filler layer 229 together configure a through substrate via 220.

Figure 14:
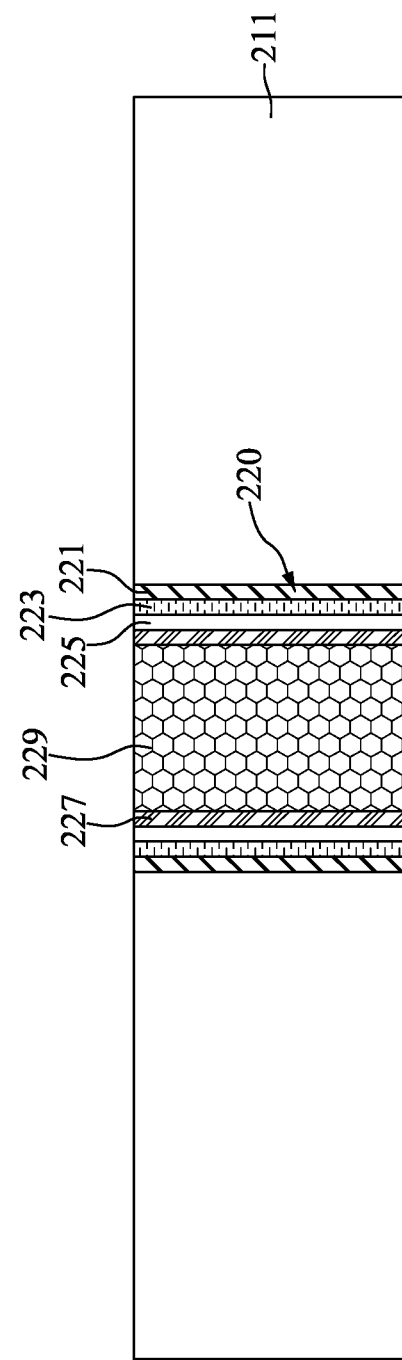

With reference to FIG. 14, a thinning process may be performed to remove a portion of the second substrate 211 from the bottom surface. The thinning process may typically use a planarization process, such as chemical mechanical polishing, a spin-wet etching technique, or a grinding process. In some embodiments, the portion of the second substrate 211 being removed during the thinning process should be sufficient to expose a lower portion of the through substrate via 220.

Figure 15:
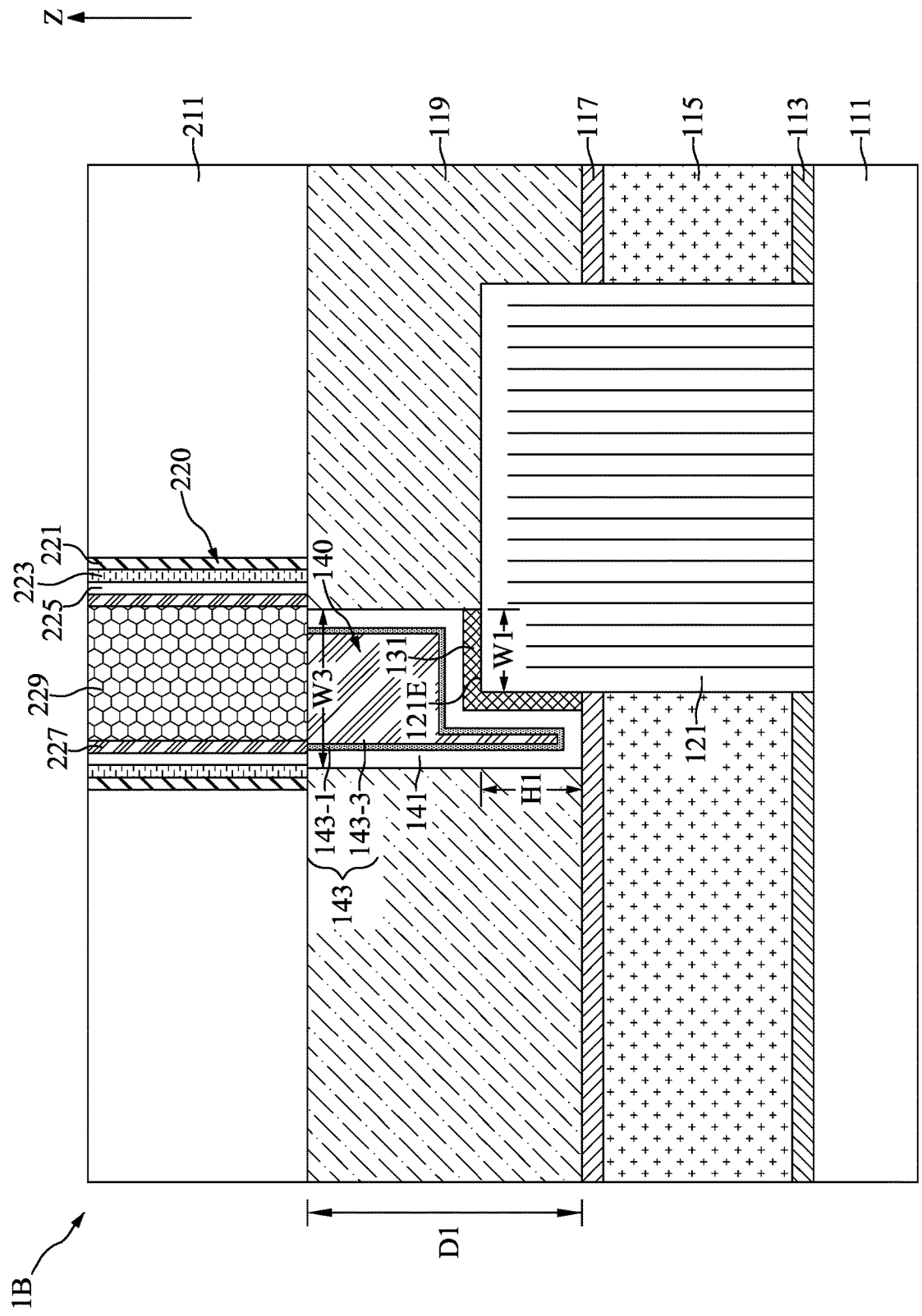

With reference to FIG. 15, an intermediate semiconductor device may be fabricated with a procedure similar to that illustrated in FIGS. 2 to 9 may be provided, and descriptions thereof are not repeated herein. The second substrate 211 including the through substrate via 220 may be bonded onto the second dielectric layer 119. The through substrate via 220 and the contact structure 140 may be electrically connected. In some embodiments, the second substrate 211 including the through substrate via 220 may be configured as an interposer to electrically couple the contact structure 140 to another conductive feature formed on the second substrate 211.

One aspect of the present disclosure provides a semiconductor device including a first substrate; a capacitor structure positioned on the first substrate and including an exposed portion; a contact structure deposited on the exposed portion; an assistant layer positioned between the contact structure and the exposed portion; and a bonding structure positioned on the contact structure. The assistant layer includes germanium or silicon germanium.

Another aspect of the present disclosure provides a semiconductor device including a first substrate; a capacitor structure positioned on the first substrate and including an exposed portion; a contact structure deposited on the exposed portion; an assistant layer positioned between the contact structure and the exposed portion; and a through substrate via positioned on the contact structure. The assistant layer includes germanium or silicon germanium.

Another aspect of the present disclosure provides a method for fabricating a semiconductor device including providing a first substrate; sequentially stacking a lower dielectric layer, a first dielectric layer, and a higher dielectric layer on the first substrate; forming a capacitor structure on the first substrate, along the lower dielectric layer, the first dielectric layer, and the higher dielectric layer, and extending upwardly from the higher dielectric layer; forming a second dielectric layer on the higher dielectric layer; forming a contact opening along the second dielectric layer to expose an exposed portion of the capacitor structure; selectively forming an assistant layer on the exposed portion over the second dielectric layer and the higher dielectric layer; forming a contact structure on the exposed portion and in the contact opening; and forming a bonding structure on the contact structure. The assistant layer includes germanium or silicon germanium.

Due to the design of the semiconductor device of the present disclosure, the resistance of the capacitor structure 121 may be reduced by employing the assistant layer 131 formed on the exposed portion 121E of the capacitor structure 121. Therefore, the exposed area of the capacitor structure 121 may be further reduced. As a result, the overlay window between the contact structure 140 to the capacitor structure 121 may be increased which increases the flexibility of design rule.

Although the present disclosure and its advantages have been described in detail, it should be understood that various changes, substitutions, and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   providing a first substrate;
   sequentially stacking a lower dielectric layer, a first dielectric layer, and a higher dielectric layer on the first substrate;
   forming a capacitor structure on the first substrate, along the lower dielectric layer, the first dielectric layer, and the higher dielectric layer, and extending upwardly from the higher dielectric layer;
   forming a second dielectric layer on the higher dielectric layer;
   forming a contact opening along the second dielectric layer to expose an exposed portion of the capacitor structure;
   selectively forming an assistant layer on the exposed portion over the second dielectric layer and the higher dielectric layer;
   forming a contact structure on the assistant layer and in the contact opening; and
   forming a bonding structure on the contact structure;
   wherein the assistant layer comprises germanium or silicon germanium;
   wherein the exposed portion comprises silicon and/or germanium with substantially no oxygen and nitrogen;
   wherein the first dielectric layer and the second dielectric layer comprise the same material;
   wherein the higher dielectric layer consists essentially of silicon oxide;
   wherein the lower dielectric layer and the higher dielectric layer comprise the same material;
   wherein the higher dielectric layer consists essentially of silicon nitride;
   wherein a ratio of a width of the exposed portion to a width of the contact structure is between about 0.3 and about 0.7.

2. The method for fabricating the semiconductor device of claim 1, wherein a ratio of a height of the exposed portion to a depth of the contact structure is between about 0.02 and about 0.40.

3. The method for fabricating the semiconductor device of claim 2, wherein selectively forming the assistant layer on the exposed portion over the second dielectric layer and the higher dielectric layer comprises introducing a reactive gas to the contact opening, and the reactive gas comprises a germanium precursor.

4. The method for fabricating the semiconductor device of claim 3, wherein the germanium precursor comprises one or more of germane, digermane, isobutylgermane, chlorogermane, or dichlorogermane.

\* \* \* \* \*